(12) United States Patent
Tapily et al.

(10) Patent No.: US 10,410,861 B2
(45) Date of Patent: Sep. 10, 2019

(54) METHOD OF FILLING RETROGRADE RECESSED FEATURES

(71) Applicant: Tokyo Electron Limited, Minato-ku, Tokyo (JP)

(72) Inventors: Kandabara N. Tapily, Albany, NY (US); Gerrit J. Leusink, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/914,831

(22) Filed: Mar. 7, 2018

(65) Prior Publication Data

US 2018/0261450 A1 Sep. 13, 2018

Related U.S. Application Data

(60) Provisional application No. 62/468,192, filed on Mar. 7, 2017.

(51) Int. Cl.
*H01L 21/02* (2006.01)
*H01L 21/311* (2006.01)

(52) U.S. Cl.
CPC ...... *H01L 21/0262* (2013.01); *H01L 21/0228* (2013.01); *H01L 21/0234* (2013.01); *H01L 21/02164* (2013.01); *H01L 21/02216* (2013.01); *H01L 21/02274* (2013.01); *H01L 21/02277* (2013.01); *H01L 21/31116* (2013.01)

(58) Field of Classification Search
CPC .......... H01L 21/0262; H01L 21/02274; H01L 21/0228; H01L 21/02164; H01L 21/0234
See application file for complete search history.

(56) References Cited

U.S. PATENT DOCUMENTS

| 7,902,075 | B2* | 3/2011 | Grivna | H01L 21/76232 438/702 |
| 8,263,474 | B2 | 9/2012 | Dip et al. | |
| 2014/0134827 | A1* | 5/2014 | Swaminathan | H01L 21/76224 438/437 |
| 2015/0228534 | A1* | 8/2015 | Wu | H01L 21/76224 257/506 |

* cited by examiner

*Primary Examiner* — Duy Vu N Deo

(57) ABSTRACT

Methods for void-free material filling of fine recessed features have been disclosed in various embodiments. According to one embodiment, the method includes a) providing a substrate containing a recessed feature having an opening, a sidewall and a bottom, the sidewall including an area of retrograde profile relative to a direction extending from a top of the recessed feature to the bottom of the recessed feature, b) depositing an amount of a material in the recessed feature, the material having a greater thickness at the bottom than on the sidewall of the recessed feature, c) stopping the depositing in step b) before the recessed feature is fully filled with the material, d) etching a portion of the material from the recessed feature, and e) depositing an additional amount of the material to fully fill the recessed feature with the material without any voids in the recessed feature.

20 Claims, 7 Drawing Sheets

FIG. 1A  FIG. 1B

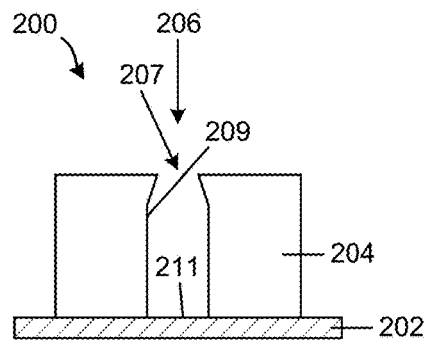
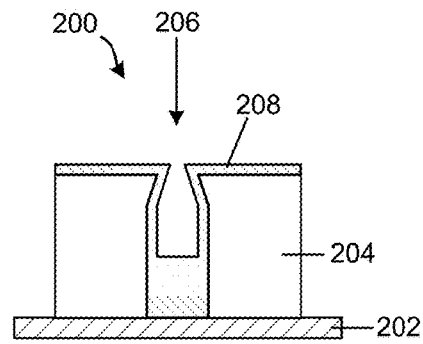
FIG. 2A  FIG. 2B
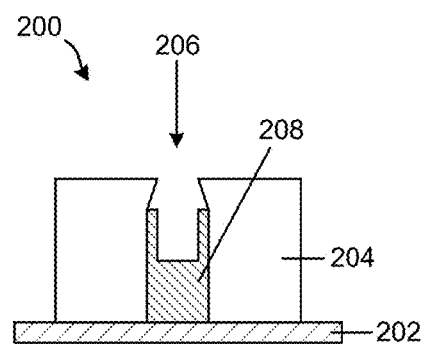
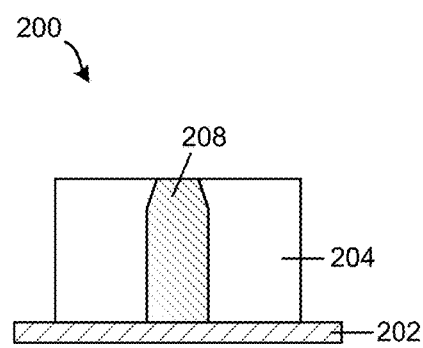
FIG. 2C  FIG. 2D
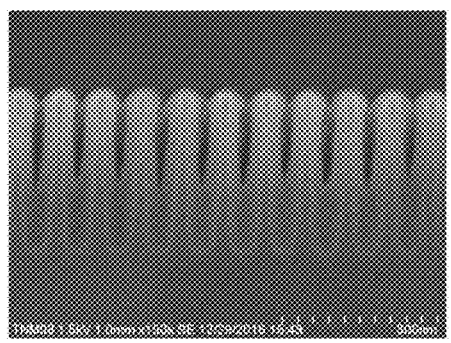
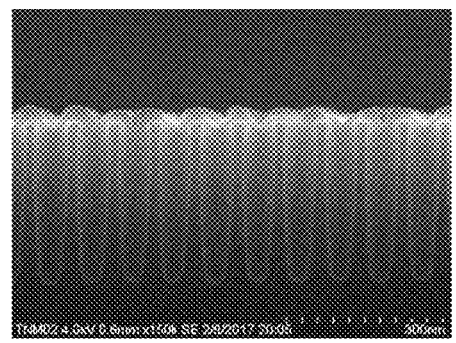
FIG. 2E  FIG. 2F

US 10,410,861 B2

METHOD OF FILLING RETROGRADE RECESSED FEATURES

CROSS-REFERENCE TO RELATED APPLICATIONS

This application is related to and claims priority to U.S. Provisional Patent Application Ser. No. 62/468,192 filed on Mar. 7, 2017, the entire contents of which are herein incorporated by reference.

FIELD OF THE INVENTION

This invention relates to methods for processing a substrate, and more particularly to methods for void-free material filling of fine recessed features.

BACKGROUND OF THE INVENTION

As smaller transistors are manufactured, the critical dimension (CD) or resolution of patterned features is becoming more challenging to produce. Self-aligned patterning needs to replace overlay-driven patterning so that cost-effective scaling can continue even after EUV introduction. Patterning options that enable reduced variability, extend scaling and enhanced CD and process control are needed. Selective deposition of thin films such as void-less filing of recessed features is a key step in patterning in highly scaled technology nodes. However it's extremely challenging to fill retrograde recessed features with a material without creating a void in the material.

Silicon dioxide ($SiO_2$) is the most common dielectric material in silicon microelectronic devices. However, despite its importance, void-less and seamfree filling of fine recessed features with $SiO_2$ material has proved difficult at low temperatures.

SUMMARY OF THE INVENTION

Embodiments of the invention describe methods for processing a substrate, and more particularly, a method for void-free material filling of fine recessed features. According to one embodiment, the method includes a) providing a substrate containing a recessed feature having an opening, a sidewall and a bottom, the sidewall including an area of retrograde profile relative to a direction extending from a top of the recessed feature to the bottom of the recessed feature, b) depositing an amount of a material in the recessed feature, the material having a greater thickness at the bottom than on the sidewall of the recessed feature, c) stopping the depositing in step b) before the recessed feature is fully filled with the material, d) etching a portion of the material from the recessed feature, and e) depositing an additional amount of the material to fully fill the recessed feature with the material without any voids in the recessed feature.

According to another embodiment, the method includes a) providing a substrate containing a recessed feature having an opening, a sidewall and a bottom, the sidewall including an area of retrograde profile relative to a direction extending from a top of the recessed feature to the bottom of the recessed feature, b) depositing an amount of a material in the recessed feature, the material having a greater thickness at the bottom than on the sidewall of the recessed feature, c) stopping the depositing in b) before the recessed feature is fully filled with the material, and d) etching a portion of the material from the recessed feature. The method further includes e) repeating steps b)-d) at least once, and f) depositing an additional amount of the material to fully fill the recessed feature with the material without any voids in the recessed feature.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention.

FIGS. 1A and 1B schematically show through cross-sectional views a problem of a void forming when filling a retrograde recessed feature with a material;

FIGS. 2A-2D schematically shows through cross-sectional views a method of void-free material filling of a recessed feature with a retrograde profile according to an embodiment of the invention;

FIGS. 2E and 2F show SEM images of a process of filling retrograde recessed features with a $SiO_2$ material according to an embodiment of the invention;

DETAILED DESCRIPTION OF SEVERAL EMBODIMENTS

Embodiments of the invention describe methods for processing a substrate, and more particularly, to a method for void-free material filling of fine recessed features used in microelectronic devices.

Figure 1C:
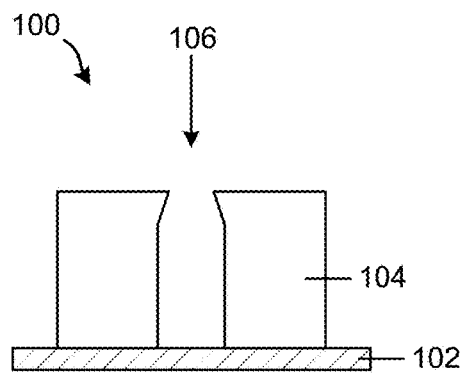
FIG. 1C shows a Scanning Electron Microscope (SEM) image of voids formed when filling retrograde recessed features with a $SiO_2$ material.
Figure 1C:
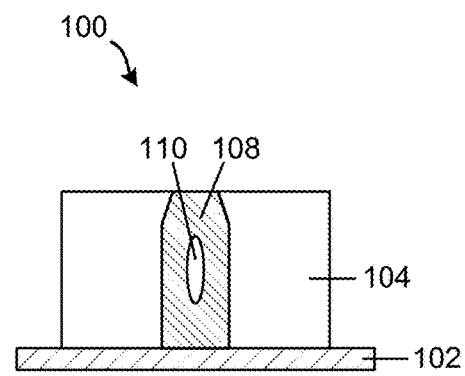
Figure 1C:
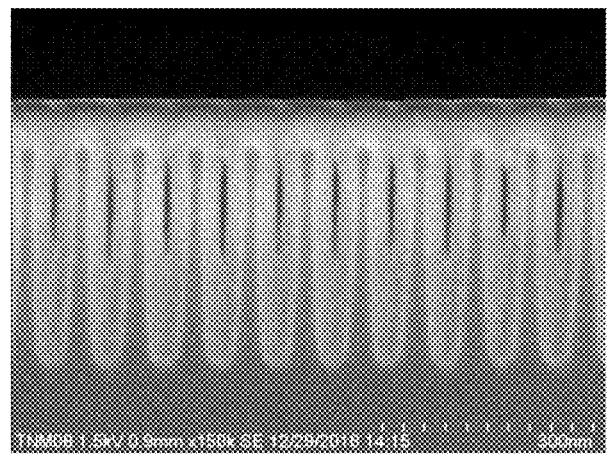

FIGS. 1A and 1B schematically show through cross-sectional views a problem of a void forming when filling a retrograde recessed feature with a material. In FIG. 1A, the substrate 100 includes a base layer 102 and a patterned film 104 containing a recessed feature 106. The recessed feature 106 is extremely difficult to fill with a material (e.g., Sift material) with no voids due to the shape of the recessed feature 106. FIG. 1B shows a void 110 formed in the recessed feature 106 when the opening of the recessed feature 106 is blocked (pinched off) by the material 108 that is being deposited by vapor deposition. Excess material 108 above the recessed feature 106 may be removed in a planarization process, for example by Chemical Mechanical Polishing (CMP). FIG. 1C is a SEM image showing voids formed when filling retrograde recessed features with a $SiO_2$ material.

FIGS. 2A-2D schematically shows through cross-sectional views a method of filling a recessed feature with a retrograde profile according to an embodiment of the invention. The method includes providing a substrate 200 containing a base layer 202 and a patterned film 204 containing a recessed feature 206 having an opening 207, a sidewall 209 and a bottom 211, the sidewall 209 including an area of retrograde profile relative to a direction extending from a top of the recessed feature 206 to the bottom 211 of the recessed feature 206.

The recessed feature 206 can, for example, have a width that is between 5 nm and 10 nm, between 10 nm and 20 nm, between 20 nm and 50 nm, between 50 nm and 100 nm, between 100 nm and 200 nm, between 10 nm and 50 nm, or between 10 nm and 100 nm. The recessed feature 206 can, for example, have a depth of 25 nm, 50 nm, 100 nm, 200 nm, or greater than 200 nm. In one example, the recessed feature 206 can have a width between about 10 nm and about 50 nm, and a depth between about 100 nm and about 300 nm. The recessed feature 206 may be formed in the patterned film 204 using well-known lithography and etching processes.

As shown in FIG. 2B, the method further includes depositing an amount of a material 208 in the recessed feature 206, the material 208 having a greater thickness at the bottom 211 than on the sidewall 209 of the recessed feature 206, and stopping the depositing before the recessed feature 206 is fully filled with the material 208 or before the opening 207 of the recessed feature 206 is blocked (pinched off) by the material 208. The deposition of material 208 may be tuned so that the material 208 has a greater thickness at the bottom 211 than on the sidewall 209 of the recessed feature 206.

According to one embodiment, the material 208 that is deposited in the recessed feature 206 can contain a $SiO_2$ material. The $SiO_2$ material can be deposited by coating surfaces of the recessed feature with a metal-containing catalyst layer, and thereafter, in the absence of any oxidizing and hydrolyzing agent, and in the absence of a plasma, exposing the substrate at a substrate temperature of approximately 150° C., or less, to a process gas containing a silanol gas to deposit the $SiO_2$ material in the recessed feature. In one example the silanol gas may be selected from the group consisting of tris(tert-pentoxy) silanol (TPSOL), tris(tert-butoxy) silanol, and bis(tert-butoxy)(isopropoxy) silanol.

In some examples, the process gas may further contain an inert gas such as Argon. In one embodiment, the process gas may consist of a silanol gas and an inert gas. Furthermore, according to one embodiment, the substrate temperature during the exposing may be approximately 120° C., or less. In yet another embodiment, the substrate temperature during the exposing may be approximately 100° C., or less.

According to one embodiment, the metal-containing catalyst layer can contain aluminum (Al), titanium (Ti), or a combination thereof. In accordance with some embodiments of the invention, the metal-containing catalyst layer may contain a metal-containing layer. Examples of metal-containing layers include layers that contain Al, Ti, or both Al and Ti. According to one embodiment, the metal-containing layer is selected from the group consisting of Al, $Al_2O_3$, AlN, AlON, an Al-containing precursor, Al-alloys, CuAl, TiAlN, TaAlN, Ti, TiAlC, $TiO_2$, TiON, TiN, a Ti-containing precursor, Ti-alloys, and combinations thereof.

Embodiments of the invention may utilize a wide variety of Al-containing precursors. For example, many aluminum precursors have the formula:

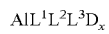

$AlL^1L^2L^3D_x$ where $L^1$, $L^2$, $L^3$ are individual anionic ligands, and D is a neutral donor ligand where x can be 0, 1, or 2. Each $L^1$, $L^2$, $L^3$ ligand may be individually selected from the groups of alkoxides, halides, aryloxides, amides, cyclopentadienyls, alkyls, silyls, amidinates, β-diketonates, ketoiminates, silanoates, and carboxylates. D ligands may be selected from groups of ethers, furans, pyridines, pyroles, pyrolidines, amines, crown ethers, glymes, and nitriles.

Other examples of aluminum precursors include: $AlMe_3$, $AlEt_3$, $AlMe_2H$, $[Al(OsBu)_3]_4$, $Al(CH_3COCHCOCH_3)_3$, $AlCl_3$, $AlBr_3$, $AlI_3$, $Al(OiPr)_3$, $[Al(NMe_2)_3]_2$, $Al(iBu)_2Cl$, $Al(iBu)_3$, $Al(iBu)_2H$, $AlEt_2Cl$, $Et_3Al_2(OsBu)_3$, and $Al(THD)_3$.

Embodiments of the invention may utilize a wide variety of Ti-containing precursors. Examples include Ti-containing precursors having "Ti—N" intra-molecular bonds include $Ti(NEt_2)_4$ (TDEAT), $Ti(NMeEt)_4$ (TEMAT), $Ti(NMe_2)_4$ (TDMAT). Other examples include Ti-containing precursors containing "Ti—C" intra-molecular bonds include $Ti(COCH_3)(\eta^5C_5H_5)_2Cl$, $Ti(\eta^5C_5H_5)Cl_2$, $Ti(\eta^5C_5H_5)Cl_3$, $Ti(\eta^5-C_5H_5)_2Cl_2$, $Ti(\eta^5-C_5(CH_3)_5)Cl_3$, $Ti(CH_3)(\eta^5-C_5H_5)_2$ Cl, $Ti(\eta^5-C_9H_7)_2Cl_2$, $Ti((\eta^5-C_5(CH_3)_5)_2Cl$, $Ti((\eta^5-C_5 (CH_3)_5)_2Cl_2$, $Ti(\eta^5-C_5H_5)_2(\eta-Cl)_2$, $Ti(\eta^5-C_5H_5)_2(CO)_2$, $Ti(CH_3)_3(\eta^5-C_5H_5)$, $Ti(CH_3)_2(\eta^5-C_5H_5)_2$, $Ti(CH_3)_4$, $Ti(\eta^5-C_5H_5)(\eta^7-C_7H_7)$, $Ti(\eta^5-C_5H_5)(\eta^8-C_8H_8)$, $Ti(C_5H_5)_2(\eta^5-C_5H_5)_2$, $Ti((C_5H_5)_2)_2(\eta-H)_2$, $Ti(\eta^5-C_5(CH_3)_5)_2$, $Ti(\eta^5-C_5 (CH_3)_5)_2(H)_2$, and $Ti(CH_3)_2\eta^5-C_5(CH_3)_5)_2$. $TiCl_4$ is an example of a titanium halide precursor containing a "Ti-halogen" bond.

According to some embodiments, the material 208 that is deposited in the recessed feature 206 can contain a metal oxide, a metal nitride, or a metal oxynitride. Examples of a metal oxide include $HfO_2$, $ZrO_2$, $TiO_2$, and $Al_2O_3$.

As shown in FIG. 2C, the method further includes etching a portion of the material 208 from the recessed feature 206. In the case of a $SiO_2$ material 208, a chemical oxide removal (COR) process may be used that efficiently etches $SiO_2$. The COR process can include simultaneous HF and $NH_3$ exposures, followed by annealing to remove etch products from the substrate 200. In one example, the simultaneous HF and $NH_3$ exposures may be performed at 35° C., followed by annealing at 175° C. FIG. 2E shows a SEM image where a portion of a $SiO_2$ material has been etched from a plurality of recessed features.

As shown in FIG. 2D, the method further includes depositing an additional amount of the material 208 to fully fill the recessed feature 206 with the material 208 without any voids in the recessed feature 206. Excess material 208 above the recessed feature 206 may be removed in a planarization process, for example by CMP. FIG. 2F shows a SEM image of a plurality of recessed features filled with $SiO_2$ material with no voids.

FIGS. 3A-3E schematically show through cross-sectional views a method of void-free material filling of a recessed feature with a retrograde profile according to an embodiment of the invention. The method includes providing a substrate 300 containing a base layer 302 and a patterned film 304 containing a recessed feature 306 with a retrograde profile as the recessed feature 206 in FIG. 2A.

Figure 3A:
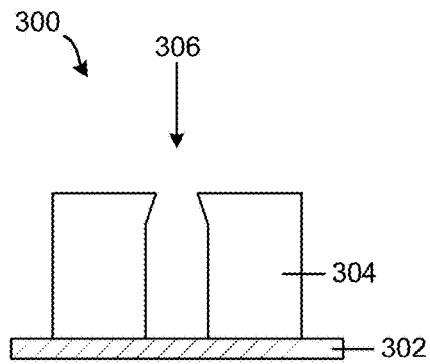
FIGS. 3A-3E schematically show through cross-sectional views a method of void-free material filling of a recessed feature with a retrograde profile according to an embodiment of the invention.
Figure 3B:
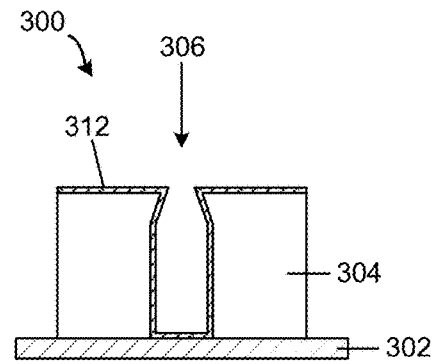

The method includes depositing a conformal etch stop layer 312 (e.g., $Al_2O_3$) on the substrate 300, including in the recessed feature 306. This is schematically shown in FIG. 3B. The etch stop layer 312 improves the integrity of the substrate 300 by protecting the substrate 300 during etching of deposited material from the substrate 300.

Figure 3C:
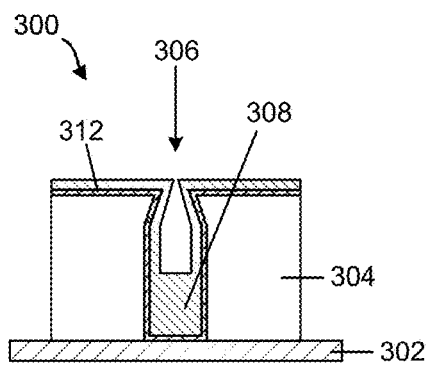

As shown in FIG. 3C, the method further includes depositing an amount of a material 308 in the recessed feature 306, the material 308 having a greater thickness at the bottom than on the sidewall of the recessed feature 306, and stopping the depositing before the recessed feature 306 is fully filled with the material 308.

Figure 3D:
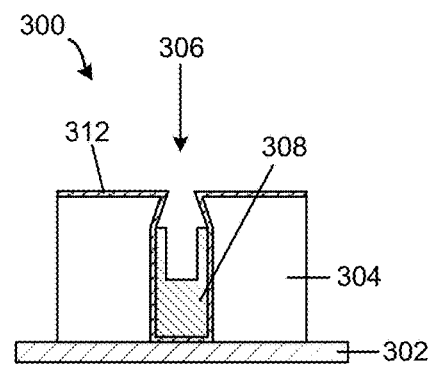

As shown in FIG. 3D, the method further includes etching a portion of the material 308 from the recessed feature 306. In one example, a COR process may be used for the etching a SiO₂ material 308 and an Al₂O₃ etch stop layer 312 is not significantly etched during a COR process.

Figure 3E:
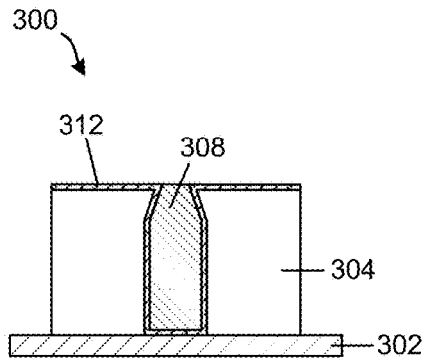
Figure 4A:
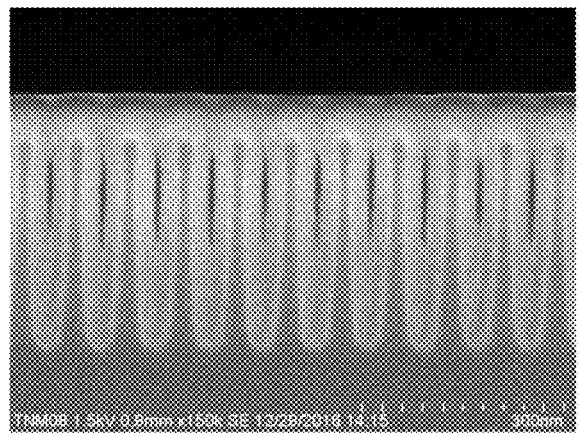
FIGS. 4A-4E show SEM images of a process of filling retrograde recessed features with a $SiO_2$ material according to an embodiment of the invention.
Figure 4B:
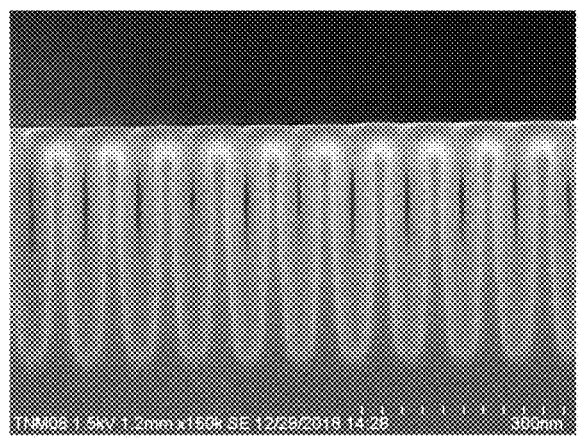
Figure 4C:
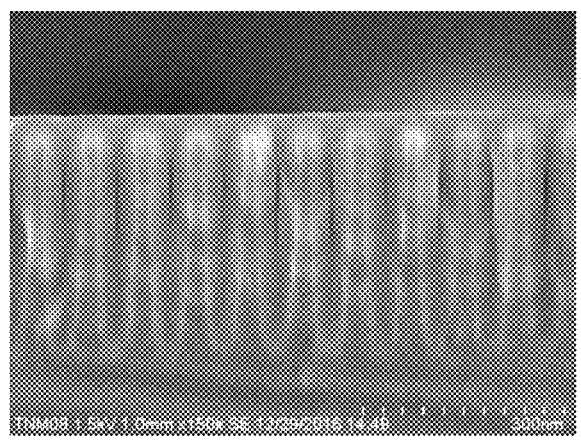
Figure 4D:
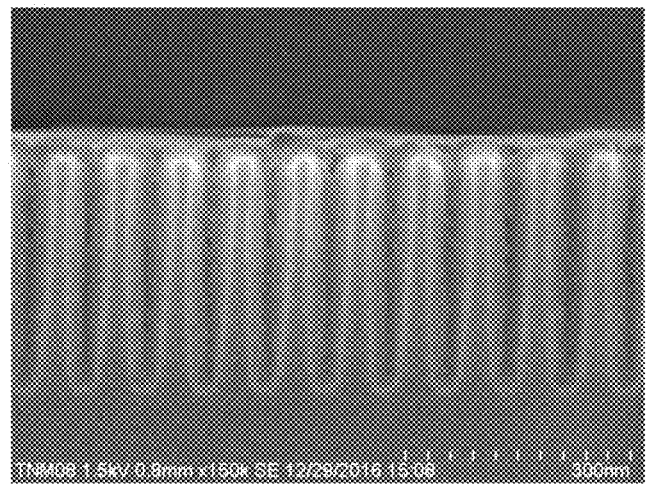
Figure 4E:
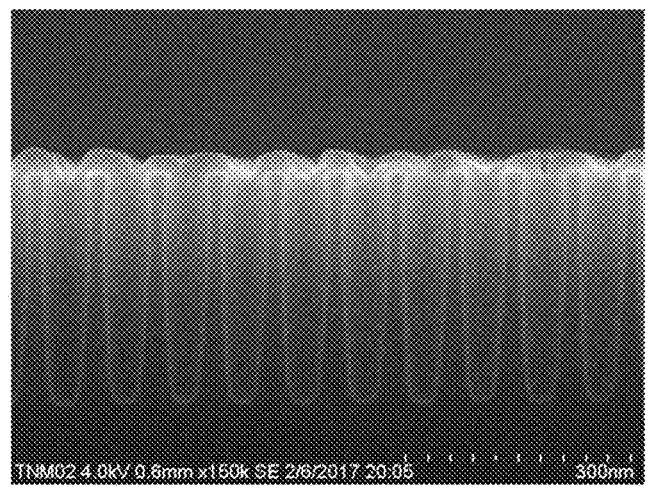

Thereafter, as shown in FIG. 3E, the method further includes depositing an additional amount of the material 308 to fully fill the recessed feature 306 with the material 308 without any voids in the recessed feature 306. Excess material 208 above the recessed feature 206 may be removed in a planarization process, for example by CMP.

According to other embodiments, the substrate processing method can include multiple depositing and etching steps. According to one embodiment, the method includes a) providing a substrate containing a recessed feature having an opening, a sidewall and a bottom, the sidewall including an area of retrograde profile relative to a direction extending from a top of the recessed feature to the bottom of the recessed feature, b) depositing an amount of a material in the recessed feature, the material having a greater thickness at the bottom than on the sidewall of the recessed feature, and c) stopping the depositing in b) before the recessed feature is fully filled with the material. The method further includes d) etching a portion of the material from the recessed feature; e) repeating steps b)-d) at least once, and f) depositing an additional amount of the material to fully fill the recessed feature with the material without any voids in the recessed feature.

FIGS. 4A-4E show SEM images of a process of filling retrograde recessed features with a SiO₂ material according to an embodiment of the invention. The SEM images show the effect of initial thickness of a deposited SiO₂ material on void formation in the recessed features. A cycle of SiO₂ material deposition included a trimethylaluminum (TMA) exposure, followed by an exposure of tris(tert-pentoxy) silanol (TPSOL), where both exposures were done at 150° C. In FIGS. 4A-4E, the number of initial SiO₂ material deposition cycles was six, five, four, three, and two, respectively. This was followed by 16 nm of SiO₂ material removal by COR processing, followed by five cycles of additional SiO₂ material deposition. The SEM images show that reducing the number of initial Sift material deposition cycles from six to two prior to the SiO₂ material removal resulted in complete filling of the recessed features after the additional SiO₂ material deposition cycles. Thus, voids in the SiO₂ material in the recessed features may be avoided by tuning the initial SiO₂ material thickness. The above results show that void-free SiO₂ material filling was achieved using only two SiO₂ material deposition steps that were interrupted by a single Sift removal process. Other results demonstrated that other process schemes that included multiple SiO₂ material removal steps, also resulted in complete SiO₂ material filling with no voids. However, a process scheme that only included a single Sift removal step provided higher throughput than process schemes that only included a single Sift removal step.

Figure 5A:
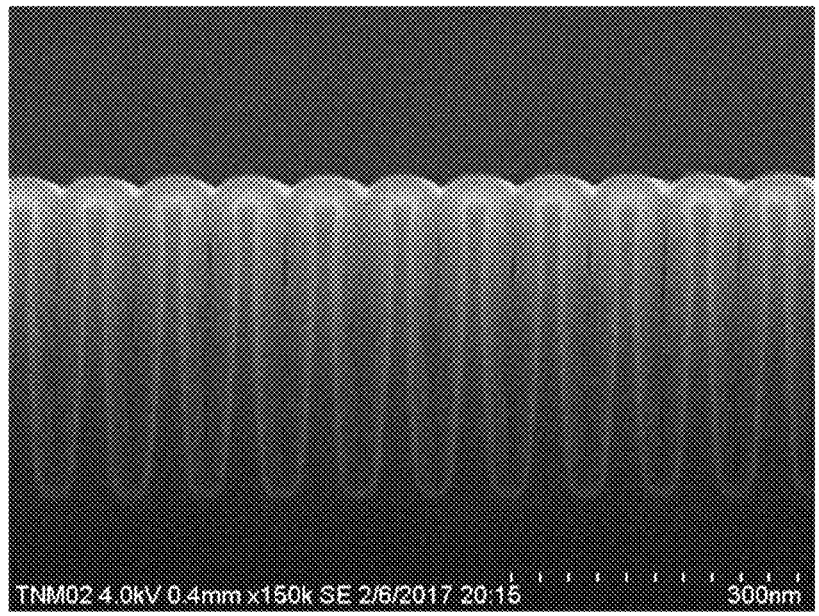
FIGS. 5A-5C show SEM images of a process of filling retrograde recessed features with a $SiO_2$ material according to an embodiment of the invention.
Figure 5B:
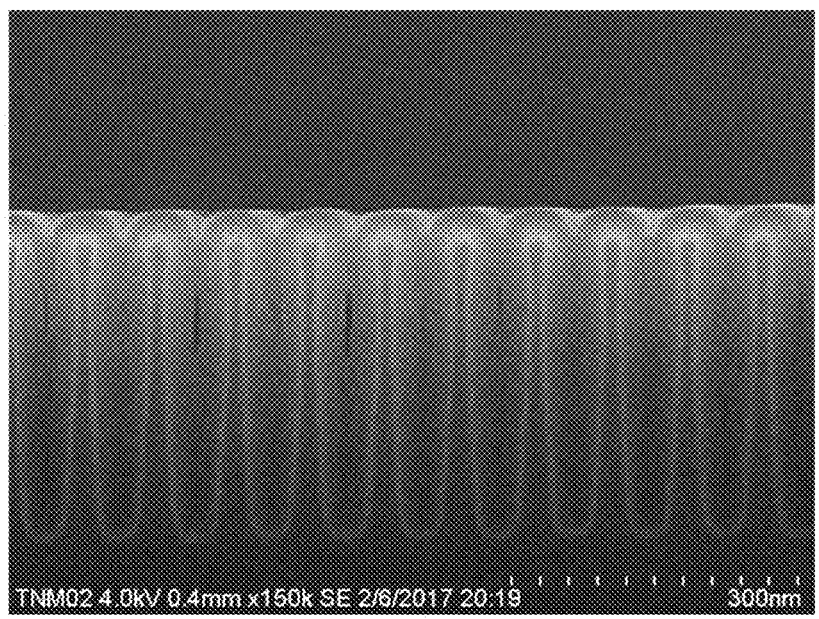
Figure 5C:
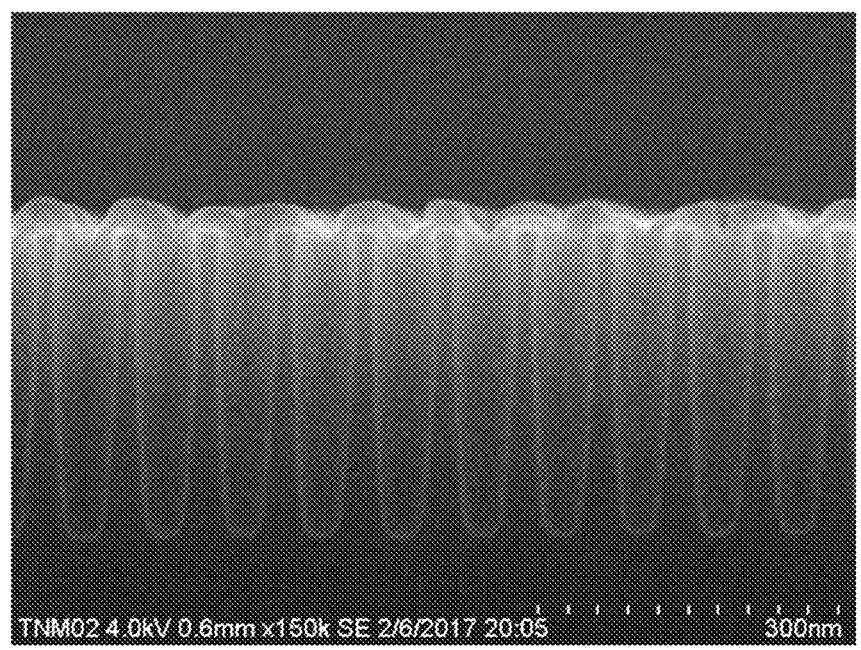

FIGS. 5A-5C show SEM images of a process of filling retrograde recessed features with a SiO₂ material according to an embodiment of the invention. The SEM images show the effect of SiO₂ material removal on void formation in the recessed features. In FIGS. 5A-5C, the number of initial SiO₂ material deposition cycles was two, followed by 8 nm, 10 nm, and 16 nm of SiO₂ material removal by COR processing, respectively. This was followed by five cycles of additional SiO₂ material deposition. The SEM images show that increasing the amount of SiO₂ material removal in the etching process resulted in complete filling of the recessed features after the additional SiO₂ material deposition cycles. Thus, any voids in the SiO₂ material in the recessed features may be avoided by tuning the amount of SiO₂ material removal in the etching process.

Methods for void-free material filling of fine recessed features have been disclosed in various embodiments. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A substrate processing method, comprising:
    a) providing a substrate containing a recessed feature having an opening, a sidewall and a bottom, the sidewall including an area of retrograde profile where the sidewall slopes toward the top of the opening and creates a smaller width at the top of the opening than a width of the sidewall;
    b) depositing an amount of a material in the recessed feature, the material having a greater thickness at the bottom than on the sidewall of the recessed feature;
    c) stopping the depositing in step b) before the recessed feature is fully filled with the material;
    d) etching a portion of the material from the recessed feature; and
    e) depositing an additional amount of the material to fully fill the recessed feature with the material without any voids in the recessed feature.

2. The method of claim 1, wherein the depositing in step b) is stopped before the opening of the recessed feature is blocked by the material.

3. The method of claim 1, wherein the material contains SiO₂, a metal oxide, a metal nitride, or a metal oxynitride.

4. The method of claim 3, wherein the SiO₂ is deposited by
    coating surfaces of the recessed feature with a metal-containing catalyst layer; and
    in the absence of any oxidizing and hydrolyzing agent, and in the absence of a plasma, exposing the substrate at a substrate temperature of approximately 150° C., or less, to a process gas containing a silanol gas.

5. The method of claim 4, wherein the silanol gas is selected from the group consisting of tris(tert-pentoxy) silanol, tris(tert-butoxy) silanol, and bis(tert-butoxy)(isopropoxy) silanol.

6. The method of claim 4, wherein the metal-containing catalyst layer contains aluminum, titanium, or a combination thereof.

7. The method of claim 4, wherein the metal-containing catalyst layer is selected from the group consisting of Al, Al₂O₃, AlN, AlON, an Al-containing precursor, Al-alloys, CuAl, TiAlN, TaAlN, Ti, TiAlC, TiO₂, TiON, TiN, a Ti-containing precursor, Ti-alloys, and combinations thereof.

8. The method of claim 4, wherein the coating includes exposing the substrate to AlMe₃ gas.

9. The method of claim 1, further comprising
    prior to step a), depositing a conformal etch stop layer on the substrate.

10. The method of claim 9, wherein the etch stop layer includes $Al_2O_3$.

11. A substrate processing method, comprising:
a) providing a substrate containing a recessed feature having an opening, a sidewall and a bottom, the sidewall including an area of retrograde profile where the sidewall slopes toward the top of the opening and creates a smaller width at the top of the opening than a width of the sidewall;
b) depositing an amount of a material in the recessed feature, the material having a greater thickness at the bottom than on the sidewall of the recessed feature;
c) stopping the depositing in b) before the recessed feature is fully filled with the material;
d) etching a portion of the material from the recessed feature;
e) repeating steps b) d) at least once; and
f) depositing an additional amount of the material to fully fill the recessed feature with the material without any voids in the recessed feature.

12. The method of claim 11, wherein the depositing in step b) is stopped before the opening of the recessed feature is blocked by the material.

13. The method of claim 11, wherein the material includes $SiO_2$, a metal oxide, a metal nitride, or a metal oxynitride.

14. The method of claim 13, wherein the $SiO_2$ is deposited by
coating surfaces of the recessed feature with a metal-containing catalyst layer; and
in the absence of any oxidizing and hydrolyzing agent, and in the absence of a plasma, exposing the substrate at a substrate temperature of approximately 150° C., or less, to a process gas containing a silanol gas.

15. The method of claim 14, wherein the silanol gas is selected from the group consisting of tris(tert-pentoxy) silanol, tris(tert-butoxy) silanol, and bis(tert-butoxy)(isopropoxy) silanol.

16. The method of claim 14, wherein the metal-containing catalyst layer contains aluminum, titanium, or a combination thereof.

17. The method of claim 14, wherein the metal-containing catalyst layer is selected from the group consisting of Al, $Al_2O_3$, AlN, AlON, an Al-containing precursor, Al-alloys, CuAl, TiAlN, TaAlN, Ti, TiAlC, $TiO_2$, TiON, TiN, a Ti-containing precursor, Ti-alloys, and combinations thereof.

18. The method of claim 14, wherein the coating includes exposing the substrate to $AlMe_3$ gas.

19. The method of claim 11, further comprising
prior to step a), depositing a conformal etch stop layer on the substrate.

20. The method of claim 19, wherein the etch stop layer includes $Al_2O_3$.

* * * * *